(12) United States Patent
Khorram

(10) Patent No.: US 7,088,969 B2
(45) Date of Patent: Aug. 8, 2006

(54) HIGHLY LINEAR POWER AMPLIFIER AND RADIO APPLICATIONS THEREOF

(75) Inventor: Shahla Khorram, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 833 days.

(21) Appl. No.: 10/074,537

(22) Filed: Feb. 12, 2002

(65) Prior Publication Data

US 2003/0152139 A1 Aug. 14, 2003

(51) Int. Cl.
*H04B 1/04* (2006.01)
*H03F 3/04* (2006.01)

(52) U.S. Cl. .............. 455/127.1; 455/127.3; 455/126; 330/310; 330/311; 330/252

(58) Field of Classification Search ............ 455/114.4, 455/126, 127.1–127.4, 67.11, 67.13, 67.14, 455/68, 69, 245.2, 251.1; 330/253, 277, 330/307, 310, 311
See application file for complete search history.

(56) References Cited

U.S. PATENT DOCUMENTS

| | | | | |
|---|---|---|---|---|
| 4,520,324 A | * | 5/1985 | Jett et al. ................ 330/285 |
| 5,923,215 A | * | 7/1999 | Hans ...................... 330/149 |
| 5,977,833 A | * | 11/1999 | Attimont et al. ............ 330/297 |
| 6,127,887 A | * | 10/2000 | Cho ....................... 330/124 R |
| 6,137,355 A | * | 10/2000 | Sevic et al. .................. 330/51 |
| 6,366,172 B1 | * | 4/2002 | Hayashi et al. ............. 330/311 |
| 6,504,433 B1 | * | 1/2003 | Weber et al. ................ 330/277 |
| 6,587,511 B1 | * | 7/2003 | Barak et al. ................ 375/295 |
| 6,636,119 B1 | * | 10/2003 | Vathulya ..................... 330/311 |
| 6,804,500 B1 | * | 10/2004 | Yamaguchi .............. 455/127.1 |

* cited by examiner

*Primary Examiner*—Duc M. Nguyen
(74) *Attorney, Agent, or Firm*—Garlick Harrison & Markison; Bruce E. Stuckman

(57) ABSTRACT

A single ended highly linear power amplifier includes a component, a $1^{st}$ transistor pair, and a $2^{nd}$ transistor pair. The $1^{st}$ and $2^{nd}$ transistor pairs are coupled in series with the component, which may be a resistor, inductor and/or linearly loaded transistor, where the node coupling the component to the $1^{st}$ and $2^{nd}$ transistor pairs provides the output of the single-ended highly linear power amplifier. The $1^{st}$ transistors of the $1^{st}$ and $2^{nd}$ transistor pairs are coupled to receive an input signal. The $2^{nd}$ transistors of the $1^{st}$ and $2^{nd}$ transistor pairs are each coupled to receive a separate enable signal. The transistor pairs are enabled via their corresponding enable signal to change the gain of the power amplifier with negligible effects on the linearity of the power amplifier. A differential power amplifier includes the single ended power amplifier and a complimentary mirror image of the single ended power amplifier.

18 Claims, 9 Drawing Sheets transmitter 100 transmitter 210

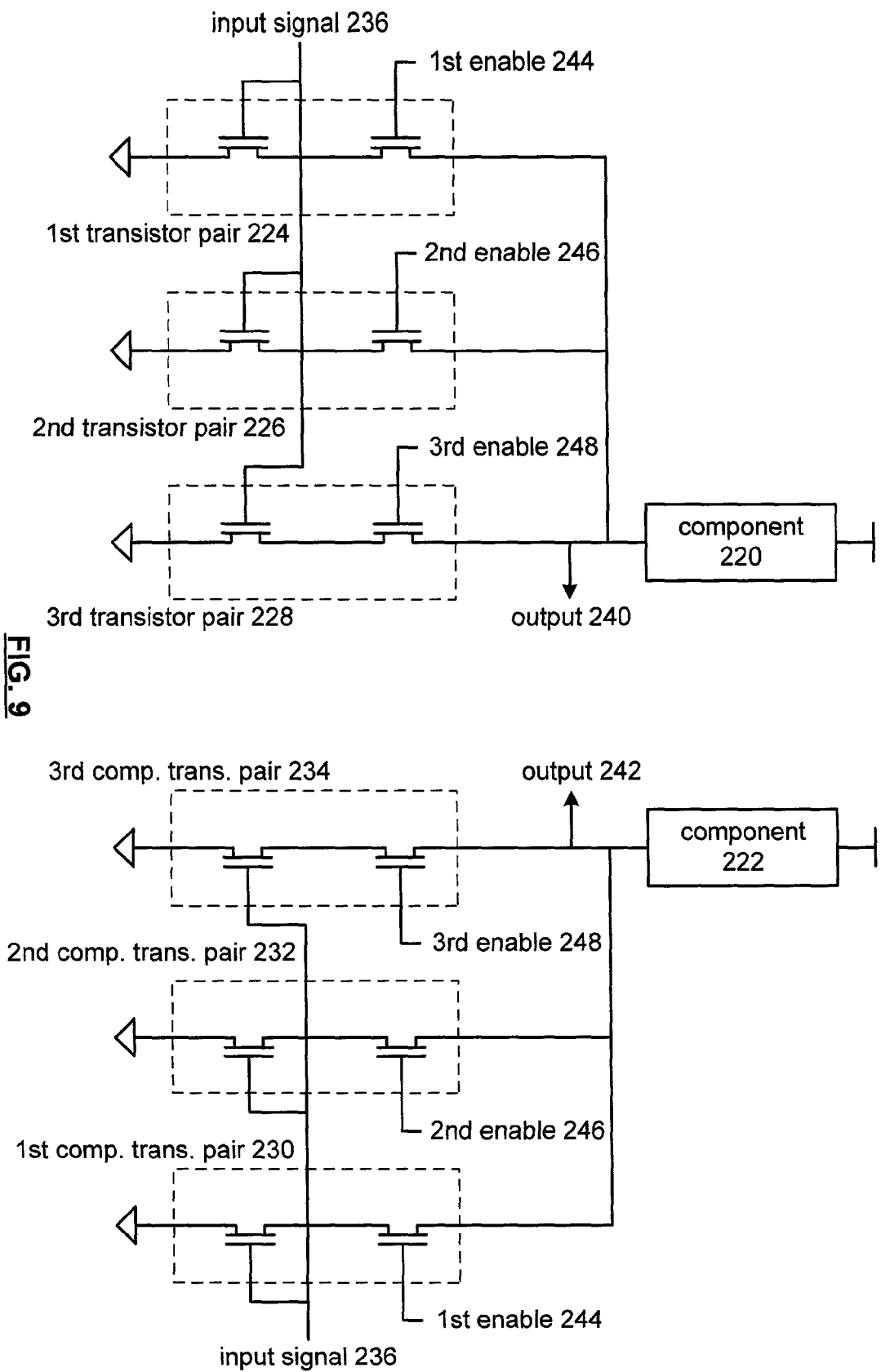

HIGHLY LINEAR POWER AMPLIFIER AND RADIO APPLICATIONS THEREOF

TECHNICAL FIELD OF THE INVENTION

This invention relates generally to communication systems and more particularly to radio transceivers used within such communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wireless application protocols (WAP), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel (e.g., one of the plurality of radio frequency (RF) carriers of the wireless communication system) and share information over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data in one or more intermediate frequency stages to produce the RF signals.

As the demand for enhanced performance (e.g., reduced interference and/or noise, improved quality of service, compliance with multiple standards, increased broadband applications, et cetera), smaller sizes, lower power consumption, and reduced costs increases, wireless communication device engineers are faced with a very difficult design challenge to develop such a wireless communication device. Typically, an engineer is forced to compromise one or more of these demands to adequately meet the others. For instance, an engineer may choose a direct conversion topology (i.e., convert directly from an RF signal to a base-band signal or directly from a base-band signal to an RF signal) to meet size requirements and/or broadband application requirements. However, for direct conversion transceivers, noise and/or interference increases due to local oscillation leakage, non-linearities due to component mismatches and/or process variations are more detrimental to overall performance, and DC offsets, which result from a slight offset between the transmitting frequency of one wireless communication device and the frequency of the receiver in another wireless communication device, are more pronounced.

As is known, local oscillation leakage results from imperfections of the mixers within a transmitter that allow the local oscillation, which equals the RF, to be present in the resultant RF signal. The local oscillation leakage can be minimized by using multiple IF stages within the transmitter. In such an implementation, each IF stage uses a local oscillation that has a significantly different frequency than the RF, with the sum of the multiple local oscillations equals the RF. Since each local oscillation has a significantly different frequency than the RF, each local oscillation is outside the RF band of interest (i.e., the frequency spectrum of the resulting RF signal). But this requires an abandoning of the direct conversion topology and its benefits with respect to size reduction, power consumption reduction, reduced costs, and reduced complexity for broadband applications.

Costs of manufacturing a radio frequency integrated circuit (IC) may be reduced by switching from one integrated circuit manufacturing process to another. For example, a CMOS process may be used instead of a bi-CMOS process since it is a more cost affective method of IC manufacture, but the CMOS process increases component mismatches, increases temperature related variations, and increases process variations. As such, noise, local oscillator leakage, non-linearities and other factors that negatively impact an RF IC performance are increased for a CMOS process. Thus, in many RF IC applications, a designer chooses between cost savings and performance.

As is further known, many wireless communication standards provide for varying the transmitting power of the transmitter based on received signal strength of the wireless communication device receiving the transmission to conserve power. For instance, if the received RF signal is very strong, the receiver can easily recapture the embedded data. In such an instance, the transmission power level of the transmitter can be reduced and still provide a sufficiently strong RF signal to enable the receiver accurately recover the embedded data. Conversely, when the received signal is too weak, the receiver cannot accurately recover the embedded data, thus the transmission power level needs to be increased. Typically, the transmitter power is increased by increasing the gain of its power amplifier. The gain of the power amplifier is increased by changing the bias level of the input signal. While this increases the gain, the linearity of the power amplifier is adversely affected, which adversely affects the performance of the transmitter and the overall radio.

Therefore, a need exists for a low power, reduced size, reduced cost, and enhanced performance radio, radio transmitter, radio receiver, and/or components thereof.

SUMMARY OF THE INVENTION

These needs and others are substantially met by the highly linear power amplifier and radio applications disclosed herein. The highly linear power amplifier, in a single-ended embodiment, includes a component, a $1^{st}$ transistor pair, and a $2^{nd}$ transistor pair. The $1^{st}$ and $2^{nd}$ transistor pairs are coupled in series with the component, which may be a resistor, inductor and/or linearly loaded transistor, where the node coupling the component to the $1^{st}$ and $2^{nd}$ transistor pairs provides the output of the single-ended highly linear power amplifier. A $1^{st}$ transistor of the $1^{st}$ transistor pair is coupled to receive an input signal and the $2^{nd}$ transistor of the pair is coupled to receive a $1^{st}$ enable signal. The $1^{st}$ transistor of the $2^{nd}$ transistor pair is coupled to receive the input signal and the $2^{nd}$ transistor of this pair is coupled to receive a $2^{nd}$ enable signal. When the $1^{st}$ enable signal is enabled and the $2^{nd}$ enable signal is disabled, the highly linear power amplifier has a $1^{st}$ gain. When the $2^{nd}$ enable signal is enabled and the $1^{st}$ is disabled, the highly linear power amplifier has a $2^{nd}$ gain. When both enable signals are enabled, the amplifier has a $3^{rd}$ gain, where gain is based on the transconductance of the $1^{st}$ transistors of the $1^{st}$ and $2^{nd}$ pair. While the gain of the highly linear amplifier can be readily changed, the linearity of the power amplifier remains substantially constant due, at least in part, to the transistor pair configuration.

In another embodiment, a differential highly linear power amplifier may be obtained by providing a mirror image of the single-ended power amplifier. Accordingly, complimentary transistor pairs are enabled based on the enable signal to change the gain of the differential highly linear power amplifier with negligible effects on its linearity.

In further embodiments, the highly linear amplifier may include a plurality of transistor pairs, each having a separate enable signal and commonly coupled to the input signal. As such, as the enable signals for the plurality of transistors are activated individually or in combination, the gain for the highly linear power amplifier is adjusted with negligible effects on its linearity.

BRIEF DESCRIPTION OF THE DRAWINGS

FIG. 9 illustrates a schematic block diagram of multi-embodiments of a highly linear power amplifier in accordance with the present invention.

DETAIL DESCRIPTION OF A PREFERRED EMBODIMENT

Figure 1:
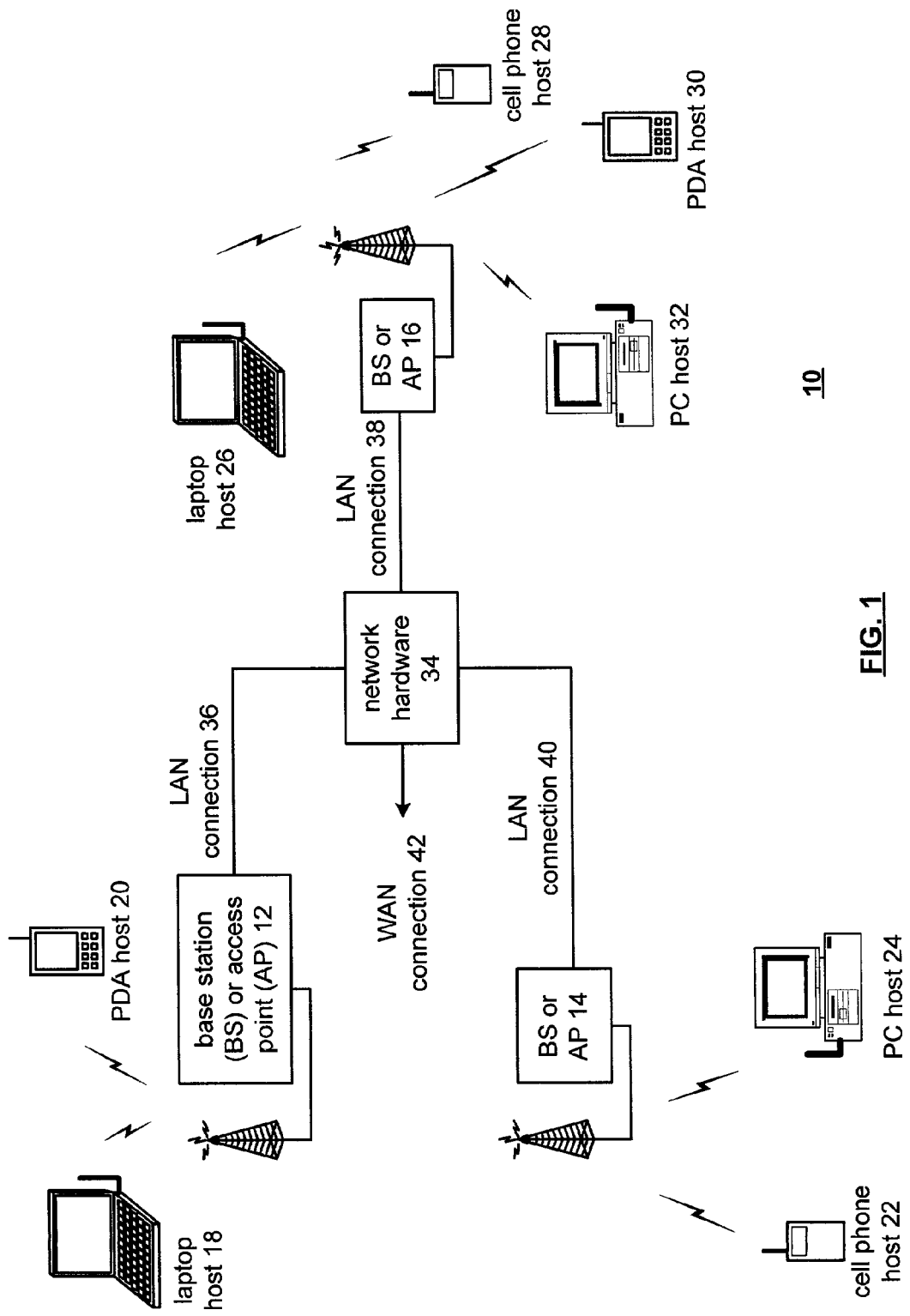
FIG. 1 illustrates a schematic block diagram of a communication system that supports wireless communication devices in accordance with the present invention.

FIG. 1 illustrates a schematic block diagram of a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
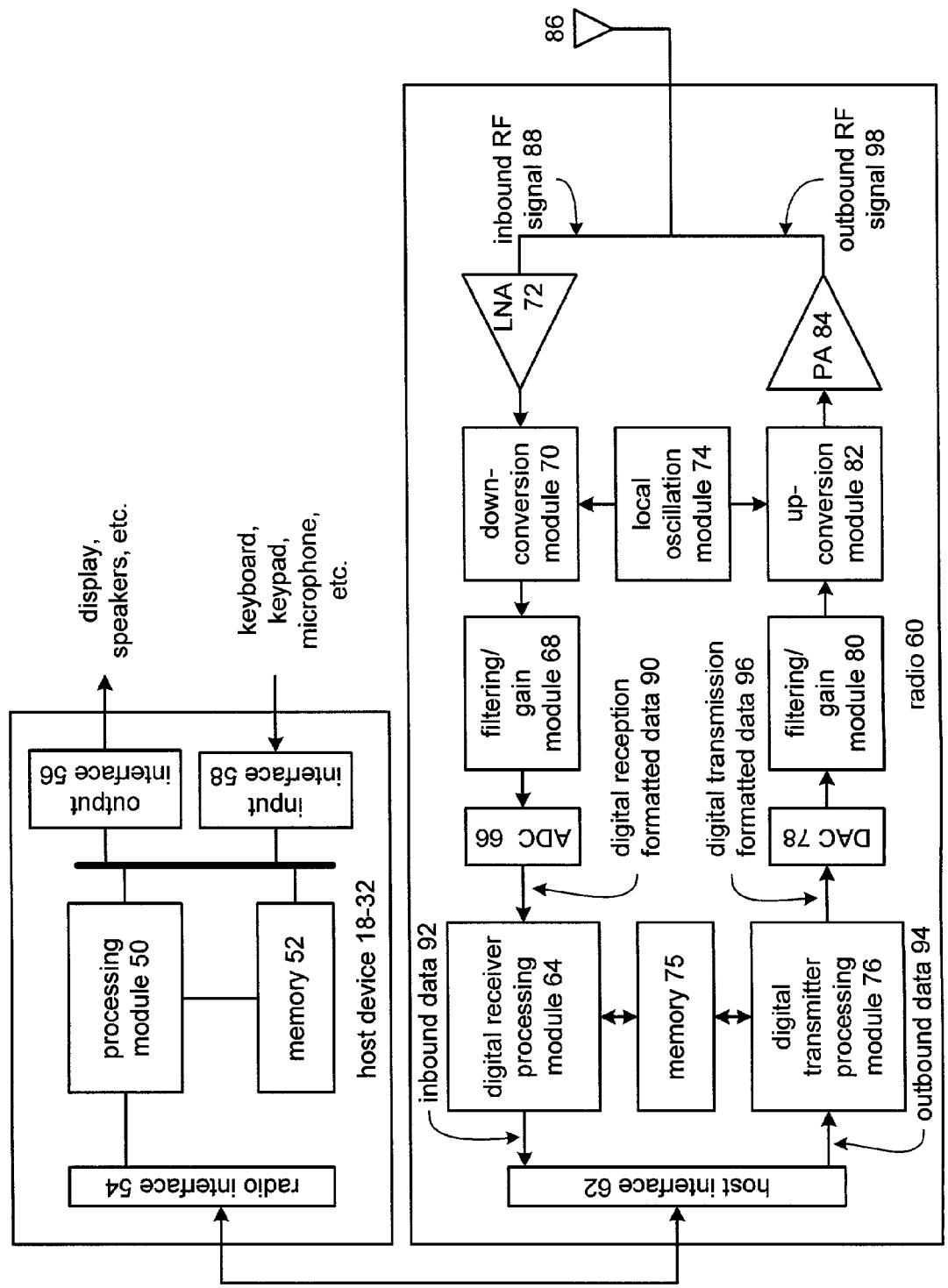
FIG. 2 illustrates a schematic block diagram of a wireless communication device in accordance with the present invention.

FIG. 2 illustrates a schematic block diagram of a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, analog-to-digital converter 66, filtering/gain module 68, down conversion module 70, low noise amplifier 72, local oscillation module 74, memory 75, digital transmitter processing module 76, digital-to-analog converter 78, filtering/gain module 80, up-conversion module 82, power amplifier 84, and an antenna 86. The antenna 86 may be a single antenna that is shared by the transmit and receive paths or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3–8.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84, which may include the highly linear power amplifier discussed in FIG. 9 and/or the programmable power amplifier discussed in FIGS. 3–7, amplifies the RF signal to produce outbound RF signal 98. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72, which amplifies the signal 88 to produce an amplified inbound RF signal. The low noise amplifier 72 provide the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

Figure 3:
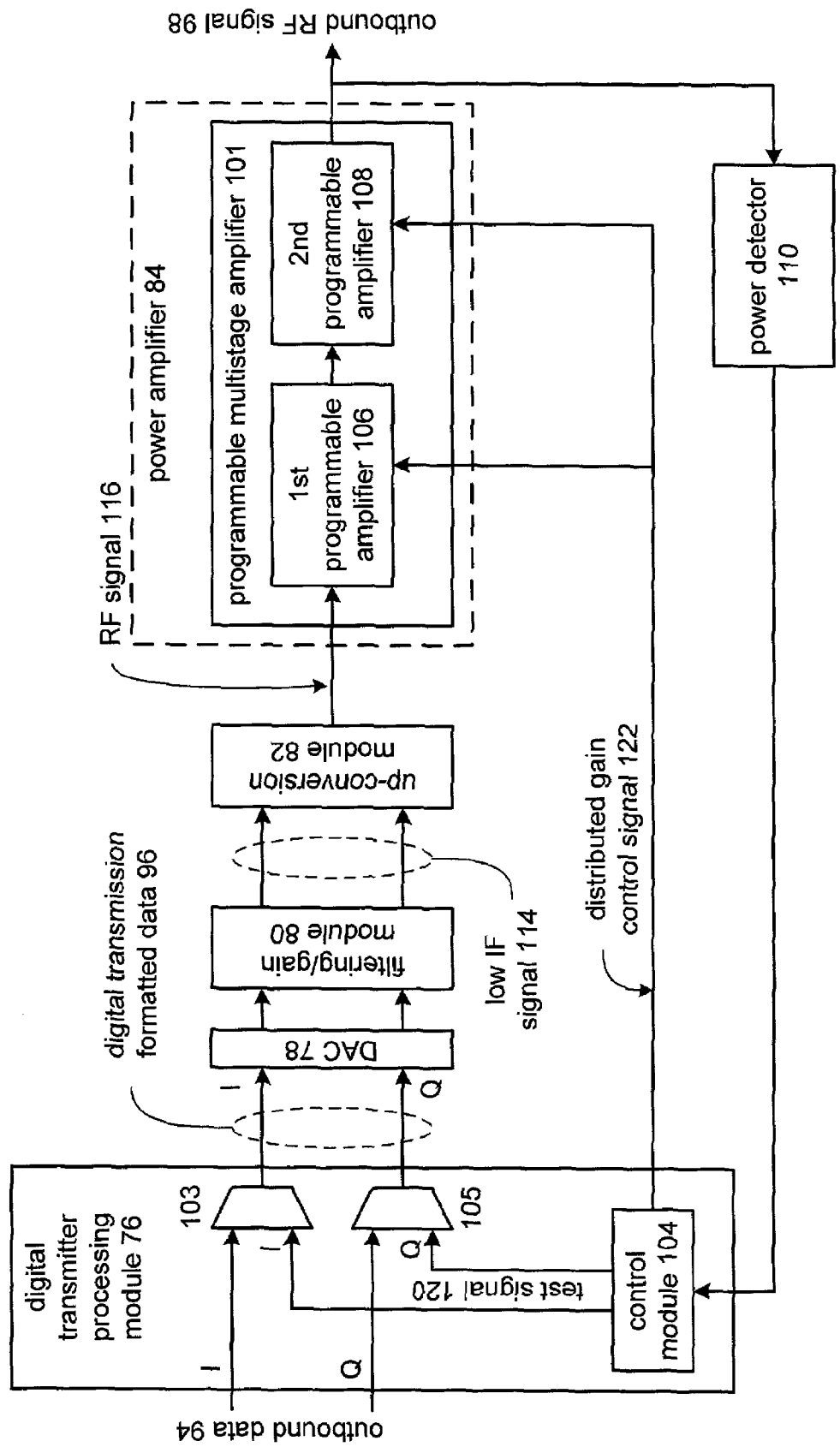
FIG. 3 illustrates a schematic block diagram of a transmitter in accordance with the present invention.

FIG. 3 illustrates a more detailed schematic block diagram of a transmitter 100 that may be used in radio 60. In this embodiment, the digital transmitter processing module 70 includes multiplexors 103 and 105 and control module 104. The power amplifier 84 is implemented utilizing a programmable multi-stage amplifier 101 that includes a $1^{st}$ programmable amplifier 106 and a $2^{nd}$ programmable amplifier 108. The transmitter 100 also includes a power detector 110 that determines the output power of the outbound RF signal 98 utilizing a transmitter signal strength indication and/or any other technique for determining output power levels of RF signals. As one of average skill in the art will appreciate, the programmable multi-stage amplifier 101 may include more than two programmable amplifiers.

During normal operation, the control module enables multiplexors 103 and 105 to pass the I and Q components of outbound data 94 to the digital-to-analog converter 78. The digital-to-analog converter 78 converts the I and Q components of the digital transmission formatted data 96 into corresponding analog signals. The filtering/gain module 80 converts the analog transmission formatted data into a low IF signal 114, which has an intermediate frequency ranging from zero Hertz to a few megahertz. The up-conversion module 82, based on a transmitter local oscillation provided by the local oscillator module 74, converts the low IF signal 114 into an RF signal 116.

The power amplifier 84, via the programmable multi-stage amplifier 101 amplifies the RF signal 116, based on a distributed gain control signal 122, to produce the outbound RF signal 98. The distributed gain control signal 122 provides a gain control signal to the $1^{st}$ programmable amplifier 106 and a gain control signal to the $2^{nd}$ programmable amplifier 108. Note that the $1^{st}$ and/or $2^{nd}$ programmable amplifiers 106 and/or 108 may be implemented in accordance with the highly linear power amplifier illustrated in FIG. 9.

To determine the distributed gain control signal 122, the control module 104 places the transmitter 100 in a test mode by enabling multiplexors 103 and 105 to respectively output an I and Q component of a test signal 120. During test mode, the digital-to-analog converter 78 converts the I and Q components of the test signal 120 into corresponding analog signals, which are subsequently filtered and/or gain adjusted by the filtering and gain module 80. The up-conversion module 82 converts the analog representation of the test signal 120 into a test RF signal based on the transmitter local oscillation. The power amplifier 84, via the programmable multi-stage amplifier 101 amplifies the RF test signal to produce an outbound RF test signal. The power detector 110 detects the power level of the outbound RF test signal and provides it back to the control module 104. Depending on what aspect the control module is currently testing (i.e., for noise level, linearity, or power levels), the control module determines whether the current setting for the gain of the $1^{st}$ programmable amplifier and $2^{nd}$ programmable amplifier 108 meets the desired limits. If so, the control module 104 switches back to normal operating mode by enabling the multiplexors 103 and 105 to pass the I and Q components of the outbound data 94.

If, however, the current gain settings for the $1^{st}$ and $2^{nd}$ programmable amplifiers 106 and 108 do not produce an output within the desired performance levels, the control module 104 changes the distributed gain control signal thus changing the gain of the $1^{st}$ and/or $2^{nd}$ programmable amplifiers. Having changed the gain, the control module 104 again provides test signal 120 to the transmitter and again determines its output power for this signal. This process continues until the outbound RF test signal is within the desired parameters.

Figure 4:
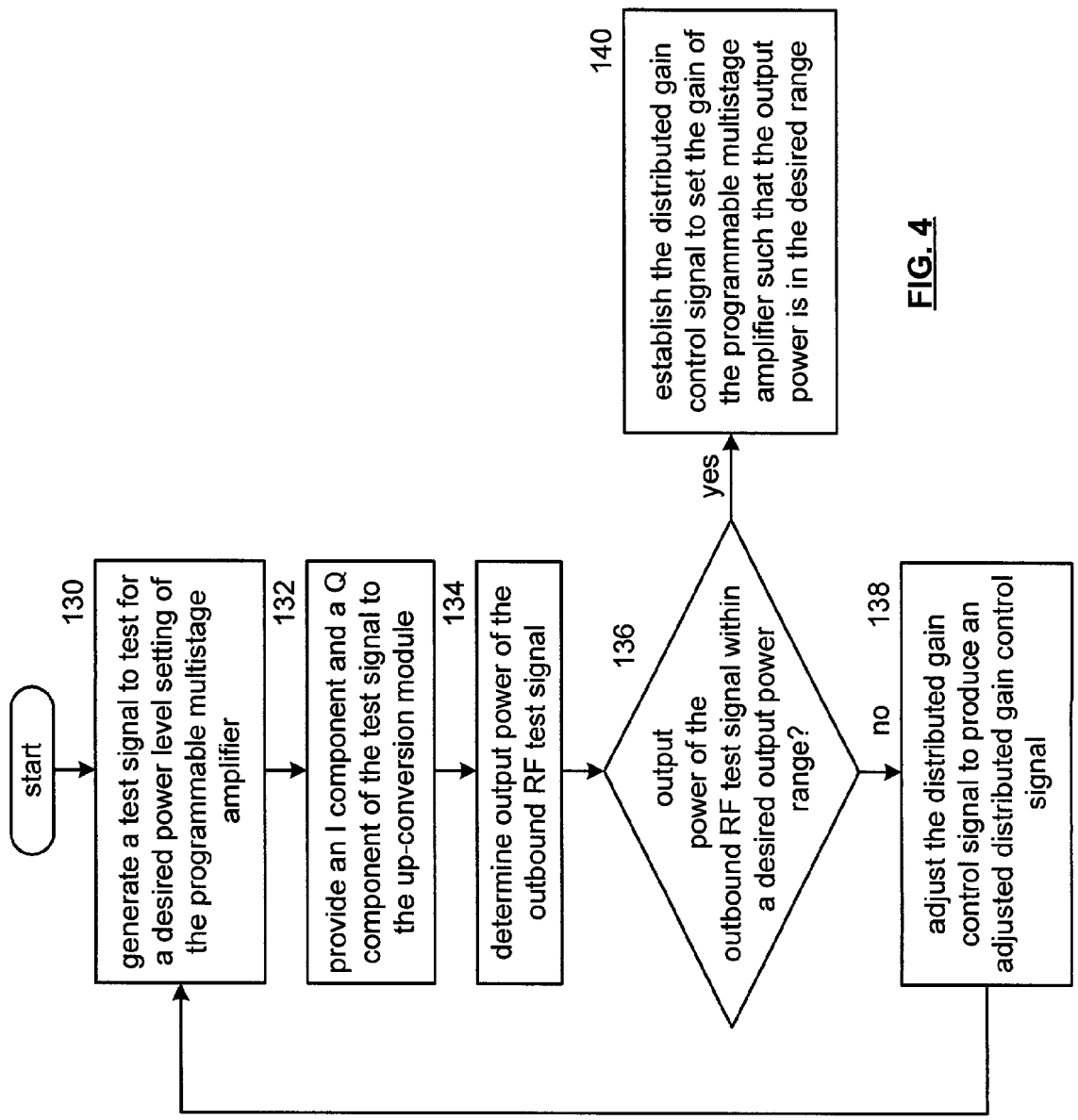
FIG. 4 illustrates a logic diagram of a method for determining gain of a programmable multi-stage amplifier based on a desired power level in accordance with the present invention.

FIG. 4 illustrates a logic diagram of a method for establishing a desired power level setting for the programmable multi-stage amplifier 101 which may be executed by control module 104. The process begins at Step 130 where the control module generates a test signal to test for a desired power level setting of the programmable multi-stage amplifier. The process then proceeds to Step 132 where the control module provides an I component and a Q component of the test signal to the up-conversion module. The up-conversion module produces an RF test signal that is amplified by the programmable multi-stage amplifier to produce an outbound RF test signal.

The process then proceeds to Step 134 where the control module determines output power of the outbound RF test signal. The process then proceeds to Step 136 where the control module determines whether the output power of the outbound RF test signal is within a desired output power range. For instance, depending on the mode of operation, the output power may be in a power conservation mode, sleep mode, or max power mode, and/or any other mode of operation that would affect the output level of the transmitter. If the output power is within the desired output range, the process proceeds to Step 140 where the distributed gain control signal is established to set the gain of the programmable multi-stage amplifier to maintain the output power in the desired range. In many instances, the gain will remain as set for the current test.

If, however, the output power of the outbound RF test signal is not within the desired output power range, the process proceeds to Step 138. At Step 138, the control module adjusts the distributed gain control signal (i.e., adjust the gain provided to the $1^{st}$ and/or $2^{nd}$ programmable amplifiers) to produce an adjusted distributed gain control signal. At this point, the process reverts back to Step 130 and repeats until the output power of the outbound RF test signal is within a desired output power range.

Figure 5:
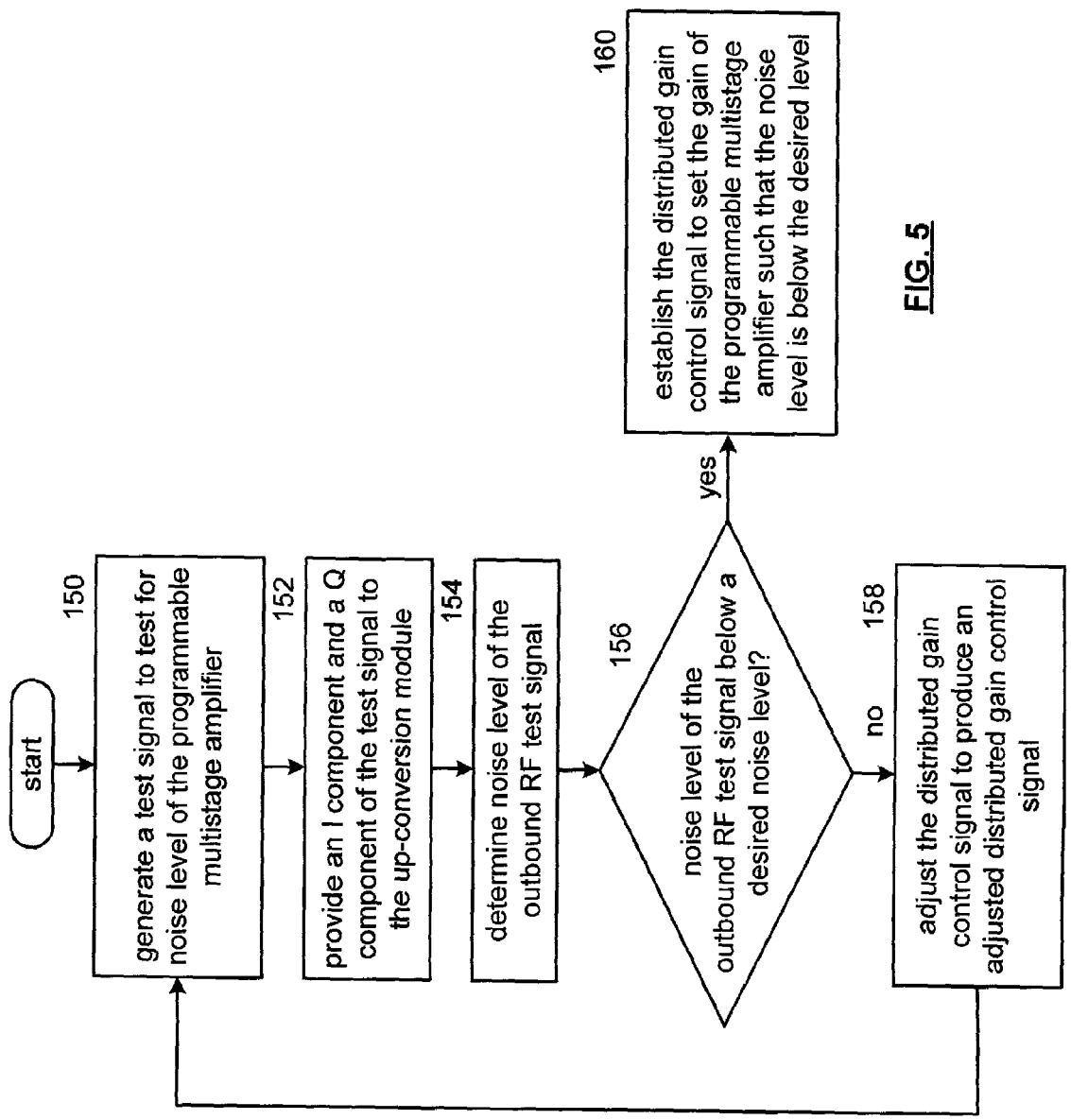
FIG. 5 illustrates a logic diagram of a method for determining gain of a programmable multi-stage amplifier based on a desired noise level in accordance with the present invention.

FIG. 5 illustrates a logic diagram of a method for determining noise level for the programmable multi-stage amplifier, which may be executed by control module 104. The process begins at Step 150 where the control module generates a test signal to test for noise level of the programmable multi-stage amplifier. The process then proceeds to Step 152 where the control module provides an I and Q component of the test signal to the up-conversion module. The up-conversion module converts the I and Q components of the test signal based on a local oscillation to produce an RF test signal. The programmable multi-stage amplifier amplifies the RF test signal to produce an outbound RF test signal.

The process then proceeds to Step 154 where the control module determines the noise level of the outbound RF test signal. The process then proceeds to Step 156 where the control module determines whether the noise level of the outbound RF test signal is below a desired noise level. If so, the process proceeds to Step 160 where the control module establishes the distributed gain control signal to set the gain of the programmable multi-stage amplifier such that the noise level is below the desired noise level.

If, however, the noise level of the outbound RF test signal is not below the desired noise level, the process proceeds to Step 158. At Step 158, the control level adjusts the distributed gain control signal (i.e., changes the gain control signal provided to the $1^{st}$ and/or $2^{nd}$ programmable amplifier) to produce an adjusted distributed gain control signal. The process then reverts back to Step 150 where the process repeats until the noise level of the outbound RF test signal is below a desired noise level. Note that the test signal may be a zero signal wherein all outputted signals is representative noise, the test signal may be a test signal having a fixed frequency and fixed amplitude such that any deviation therefrom is reflective of noise, and/or any other type of signal such that noise can be readily distinguished from the signal. As one of average skill in the art will appreciate, the noise level may be detected by a signal-to-noise ratio, and/or any other mechanism for measuring noise components of a signal.

Figure 6:
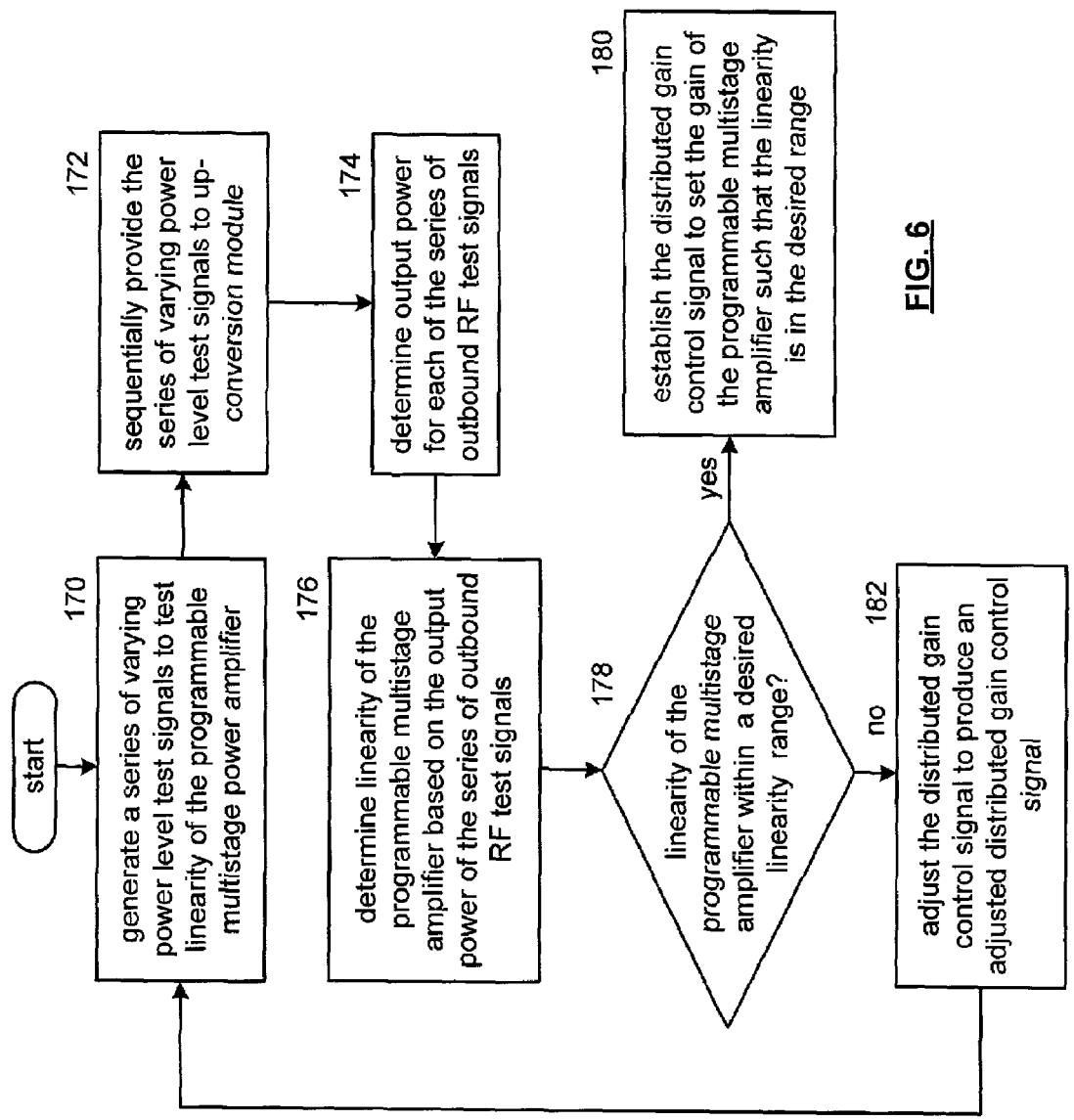
FIG. 6 illustrates a logic diagram of a method for determining gain based on linearity of a multi-stage power amplifier in accordance with the present invention.

FIG. 6 illustrates a logic diagram of a method that may be executed by the control module 104 to determine linearity of the programmable multi-stage amplifier. The process begins at Step 170 where the control module generates a series of varying power level test signals to test the linearity of the programmable multi-stage amplifier. The process then proceeds to Step 172 where the control module sequentially provides the series of varying power level test signals to the up-conversion module. The up-conversion module converts each of the test signals into RF test signals, which are subsequently amplified by the programmable multi-stage amplifier to produce a plurality of outbound RF test signals.

The process then proceeds to Step 174 where the control module determines output power for each of the series of outbound RF test signals. The process then proceeds to Step 176 where the control module determines linearity of the programmable multi-stage amplifier based on the output power of the series of output RF test signals. For instance, if the programmable multi-stage amplifier is linear, the ratio between the input power and output power for each of the test signals should be the same, within reasonable engineering tolerances.

The process then proceeds to Step 178 where the control module determines whether the linearity of the programmable multi-stage amplifier is within a desired linearity range. If so, the process proceeds to Step 180 where the control module establishes the distributed gain control signal to set the gain of the programmable multi-stage amplifier such that the linearity is within the desired range. Typically, this entails setting the gain for the $1^{st}$ and/or $2^{nd}$ programmable amplifiers at the gain used when the linearity was determined to be within the desired range.

If, however, the linearity of the programmable multi-stage amplifier is not within a desired linearity range, the process proceeds to Step 182. At Step 182, the control module adjusts the distributed gain control signal to produce an adjusted distributed gain control signal. As such, the control module is adjusting the gain of the $1^{st}$ and/or $2^{nd}$ programmable amplifier. At this point, the process repeats at Step 170 until the linearity of the programmable multi-stage amplifier is within the desired linearity range.

Figure 7:
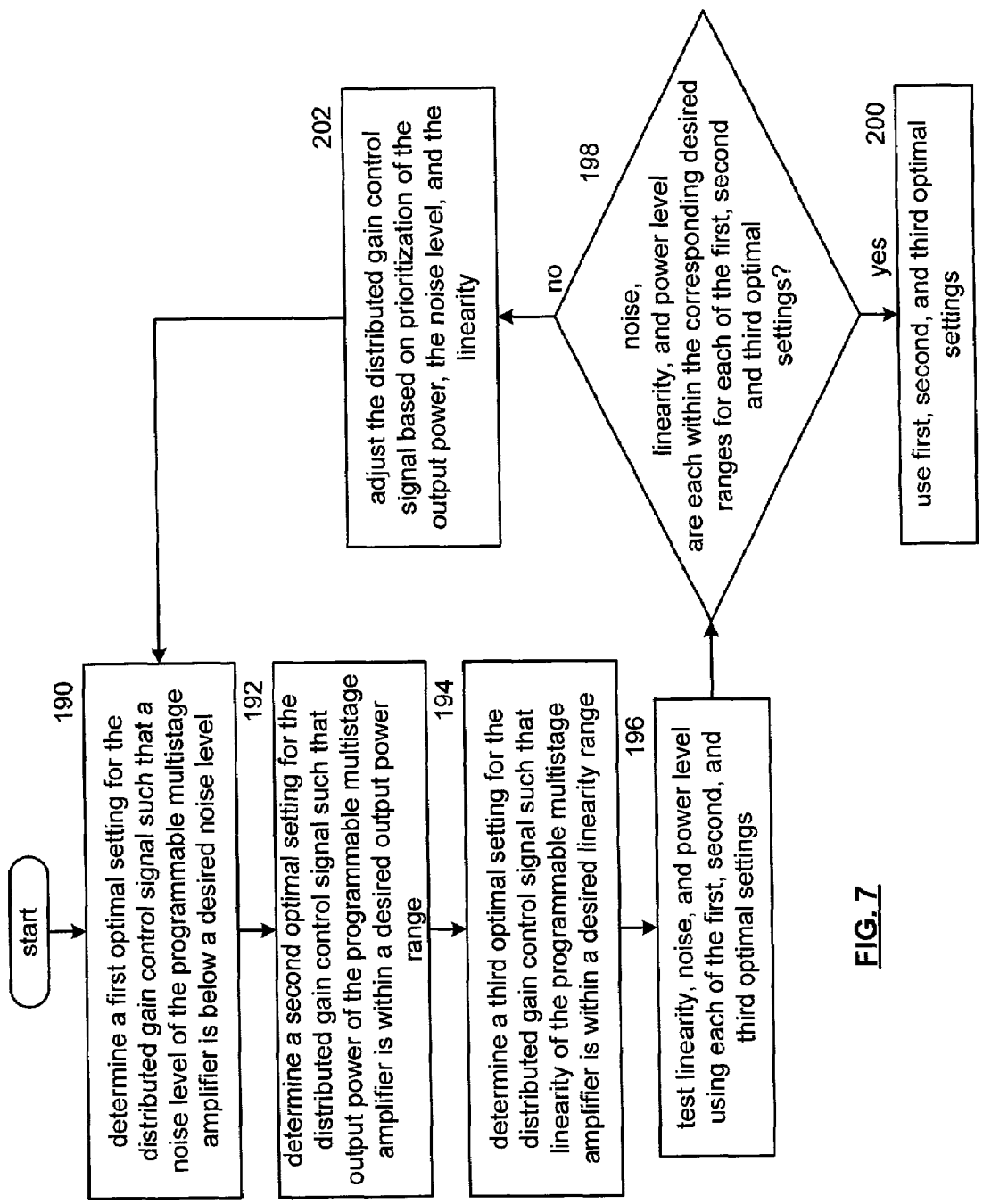
FIG. 7 illustrates a logic diagram of a method for balancing gain of a programmable multi-stage amplifier based on a desired noise level, desired output power and desired linearity in accordance with the present invention.

FIG. 7 illustrates a logic diagram of a method that may be implemented by the control module to balance the distributed gain setting signal for power levels, linearity and/or noise. The process begins at Step 90 where the control module determines a $1^{st}$ optimal setting or the distributed gain control signal such that the noise level of the programmable multi-stage amplifier is below the desired noise level. This may be done as discussed with reference to FIG. 5. The process then proceeds to Step 192 where the control module determines a $2^{nd}$ optimal setting for the distributed gain control signal such that the output power of the programmable multi-stage amplifier is within a desired output power range. This may be done in accordance with the process illustrated in FIG. 4. The process then proceeds to Step 194 where the control module determines a $3^{rd}$ optimal setting for the distributed gain control signal such that the linearity of the programmable multi-stage amplifier is within a desired linearity range. This may be done as described in FIG. 6.

The process then proceeds to Step 196 where the control module tests the linearity, noise, and power level using each of the $1^{st}$, $2^{nd}$ and $3^{rd}$ optimal settings. As such, the control module, utilizing the $1^{st}$ optimal setting, tests the linearity and power levels to determine whether they are within the respective ranges. Similarly, the control module uses the $2^{nd}$ optimal setting to determine whether the noise and linearity are at desired levels or within desired ranges. Also, the control module utilizing the $3^{rd}$ optimal setting to determine whether the power level and noise are within their respective ranges.

The process then proceeds to Step 198 where the control module determines whether, for any of the $1^{st}$, $2^{nd}$ or $3^{rd}$ optimal settings, the noise, the linearity and/or the power level is not within its desired range and/or level. If the noise, linearity and power level for all three optimal settings are within their respective ranges, the process proceeds to Step 200. At Step 200, the control module uses one, or more in combination, of the $1^{st}$, $2^{nd}$ or $3^{rd}$ optimal settings for the distributed gain control signal.

If, however, at Step 198, the response was negative, the process proceeds to Step 202. At Step 202, the control module adjusts the distributed gain control signal based on prioritization of output power, noise level or linearity. Such a prioritization would be based on the particular application and/or wireless communication standard being implemented by the radio. For example, noise and output power are of greater importance than linearity for a Bluetooth application. Conversely, linearity is a primary concern in an 802.11.a or .b application.

After adjusting the distributed gain control signal, the process reverts to Step 190. The processing continues until a distributed gain control signal can be determined which satisfies the desired noise level requirements, desired output level requirements and the desired linearity requirements. If such an optimal setting cannot be obtained, one or more of the desired output power, noise level or linearity is adjusted to reach a compromised setting.

Figure 8:
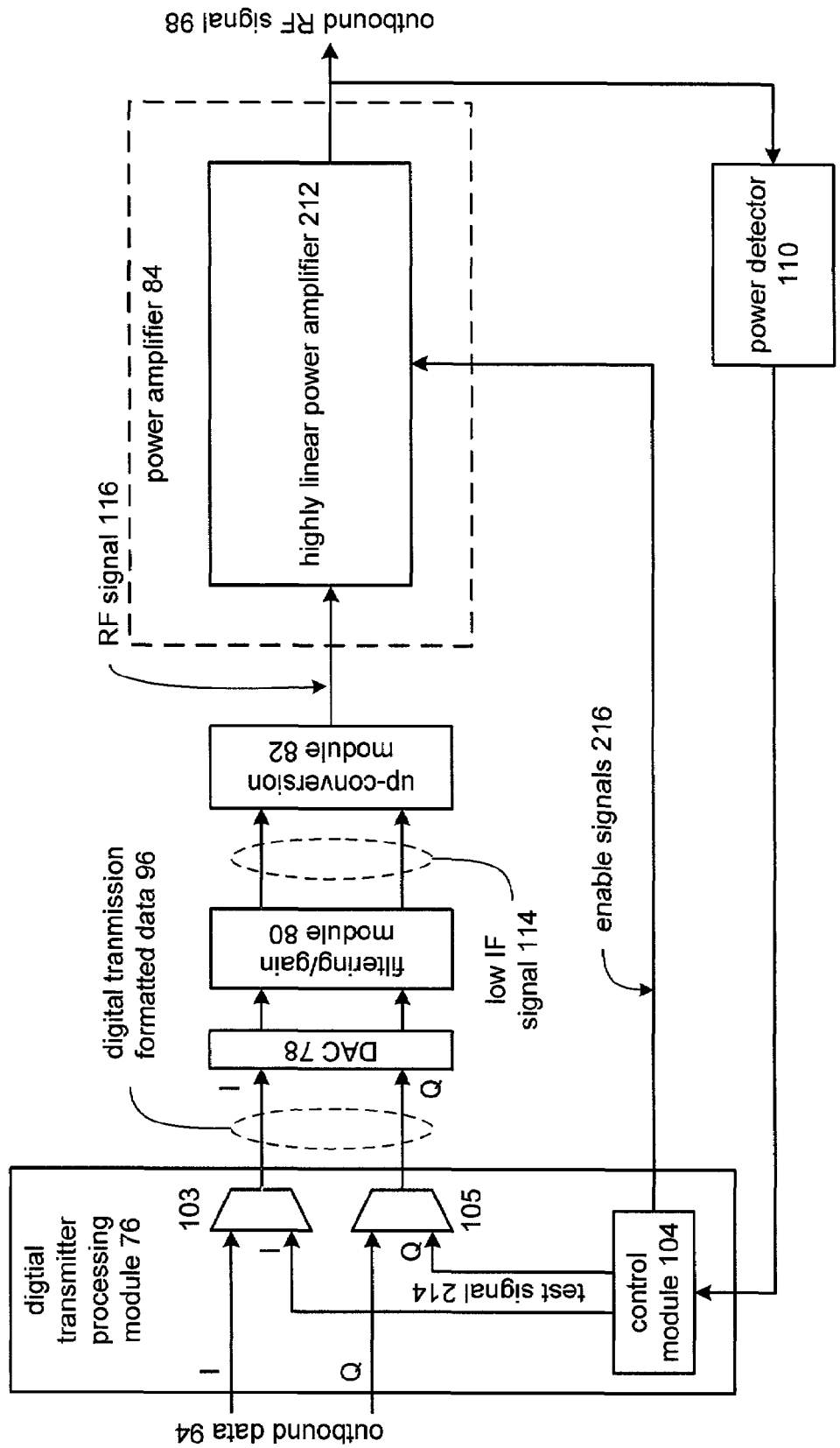
FIG. 8 illustrates a schematic block diagram of an alternate transmitter in accordance with the present invention.

FIG. 8 illustrates a schematic block diagram of an alternate transmitter 210 that may be utilized in radio 60. The transmitter 210 includes the digital transmitter processing module 76, the digital-to-analog converter 78, the filtering/gain module 80, up-conversion module 82, the power amplifier 84, and the power detector 110. The digital transmitter processing module 76 is configured to include control module 104 and multiplexors 103 and 105. The power amplifier 84 is implemented using highly linear power amplifier 212. The gain of the highly linear power amplifier 212 may be adjusted in accordance with enable signals 216 while having negligible effect on the linearity of power amplifier 212. The details of power amplifier 212 will be discussed in greater detail with reference to FIG. 9.

In operation, the control module 104 enables multiplexors 103 and 105 to output an I and Q component of outbound data 94 to the digital-to-analog converter 78. The digital-to-analog converter 78, filtering/gain module 80 and up-conversion module 82 perform as previously discussed. The highly linear power amplifier 212 amplifies the RF signal 116 at a particular gain setting, which is established via enable signals 216 to produce the outbound RF signal 98.

To determine the enable signals 216, and thus the particular gain setting for the highly linear power amplifier 212, the control module 104 provides a test signal 214 to the transmitter 210. To do this, the control module 104 enables multiplexors 103 and 105 to output an I and Q component of test signal 214. The test signal 214 propagates through the transmitter until an outbound RF test signal is produced. The power detector 110 detects the power level of this test signal and provides an indication back to control module 104. If the power level of the RF test signal is at a desired level, the control module 104 utilizes the current settings for enable signals 216.

If, however, the power level is not at the desired level, the control module 104 adjusts the enable signals to change the gain of the highly linear power amplifier 212. After making the gain adjustments, the control module 104 provides test signal 214 to transmitter 210. The test signal 214 is again propagated through transmitter 210 until its output power is detected via power detector 110. This process continues until the control module 104 determines that it has the proper settings for the gain of the highly linear power amplifier 212.

FIG. 9 illustrates a schematic block diagram of the highly linear power amplifier 212. In this illustration, the highly linear power amplifier 212 is a differential implementation. For a single implemented implementation, the complimentary transistor pairs 230, 232 and 234 and component 222 would be omitted.

The highly linear power amplifier 212, in a differential mode, includes $1^{st}$ and $2^{nd}$ components 220 and 222, which may be resistors, inductors and/or linearly loaded transistors and may further include a capacitor in parallel, a plurality of transistor pairs 224–228 and a plurality of complimentary transistor pairs 230–234. Each of the transistor pairs includes an enable transistor and an input transistor. The input transistors for the $1^{st}$, $2^{nd}$ and $3^{rd}$ transistor pairs 224–226 are operably coupled to one leg of a differential input signal 236. The input transistors of the $1^{st}$, $2^{nd}$ and $3^{rd}$ complimentary transistor pairs 230–234 are operably coupled to another leg of differential input signal 236. The enable transistors for the $1^{st}$, $2^{nd}$ and $3^{rd}$ transistor pairs 224–228 are operably coupled to individual enable signals 244, 246 and 248. The enable transistors of the complimentary transistor pairs 230–234 are also individually coupled to the $1^{st}$, $2^{nd}$ and $3^{rd}$ enable signals 244–248.

By sizing the input transistors and corresponding enable transistors of the transistor pairs with a given ratio with respect to each other, the gain of the power amplifier 212 may be adjusted while having negligible effects on the linearity. For instance, by having the input transistor of the $1^{st}$ transistor pair being twice as big as the input transistor of the $2^{nd}$ transistor pair, the gain of the $1^{st}$ transistor pair will be twice that of the $2^{nd}$ transistor pair. Yet, by matching the input transistors and enable transistors from pair to pair, with only the size changing, the gain of the amplifier may be readily changed with negligible affects on the amplifier's linearity.

As one of average skill in the art will appreciate, the $1^{st}$, $2^{nd}$ and $3^{rd}$ enable signals may be enabled in any combination to produce a desired gain for the power amplifier. As one of average skill in the art will further appreciate, the gain is cumulative as transistors are enabled within the power amplifier 212. As one of average skill in the art will further appreciate, the linearity of the device remains relatively constant as the gain changes since the bias level for the input transistors of the transistor pairs is not varied.

The preceding discussion has presented a programmable multi-stage amplifier and a highly linear power amplifier that may be used in a transmitter of a radio. By providing programmability of such devices, the performance, cost and/or broadband applications of radios are enhanced. As one of average skill in the art will appreciate, other embodiments may be derived from the teaching of the present invention, without deviating from the scope of the claims.

What is claimed is:

1. A highly linear power amplifier comprises:
   component;
   first transistor pair coupled in series with the component, wherein a first transistor of the first transistor pair is coupled to receive an input signal and wherein a second transistor of the first transistor pair is coupled to receive a first enable signal and is configured to enable the first transistor of the first transistor pair when the first enable signal is enabled and to disable the first transistor of the first transistor pair when the first enable signal is not enabled; and
   second transistor pair coupled in series with the component, wherein a first transistor of the second transistor pair is coupled to receive the input signal, wherein a second transistor of the second transistor pair is coupled to receive a second enable signal and is configured to enable the first transistor of the second transistor pair when the second enable signal is enabled and to disable the first transistor of the second transistor pair when the second enable signal is not enabled, wherein when the first enable signal is enabled the highly linear power amplifier has a first gain with a first linearity and when the second enable signal is enabled the highly linear power amplifier has a second gain with the first linearity.

2. The highly linear power amplifier of claim 1, wherein the component comprises at least one of: a resistor, an inductor, and a linearly loaded transistor.

3. The highly linear power amplifier of claim 1 further comprises:
   at least one other transistor pair coupled in series with the component, wherein a first transistor of the at least one other transistor pair is coupled to receive the input signal, wherein a second transistor of the at least one other transistor pair is coupled to receive at least one other enable signal, and wherein when the at least one other enable signal is enabled the highly linear power amplifier has at least one other gain with the first linearity.

4. The highly linear power amplifier of claim 1 further comprises:
   the first transistor of the first transistor pair has a first size to produce the first gain; and
   the first transistor of the second transistor pair has a second size to produce the second gain, wherein the first size is greater than the second size by a desired ratio such that first gain is greater than the second gain by the desire ratio.

5. The highly linear power amplifier of claim 1 further comprises:
   second component;
   first complimentary transistor pair coupled in series with the second component, wherein a first transistor of the first complimentary transistor pair is coupled to receive a complimentary input signal and wherein a second transistor of the first complimentary transistor pair is coupled to receive the first enable signal; and
   second complimentary transistor pair coupled in series with the second component, wherein a first transistor of the second complimentary transistor pair is coupled to receive the complimentary input signal, wherein a second transistor of the second complimentary transistor pair is coupled to receive the second enable signal.

6. The highly linear power amplifier of claim 1 further comprises:
   control module operably coupled to generate the first and second enable signals based on desired output levels of the highly linear power amplifier.

7. The highly linear power amplifier of claim 6, wherein the control module further comprises:
   processing module; and
   memory operably coupled to the processing module, wherein the memory includes operational instructions that cause the processing module to:
   determine a first desired output level of the highly linear power amplifier and consequently enable the second enable signal such that the highly linear power amplifier has the second gain;
   determine a second desired output level of the highly linear power amplifier and consequently enable the first enable signal such that the highly linear power amplifier has the first gain, wherein the first gain is greater than the second gain; and
   determine a third desired output level of the highly linear power amplifier and consequently enable the first and second enable signals such that the highly linear power amplifier has a cumulative gain of the first and second gains, wherein the cumulative gain is greater than the first gain.

8. A linear transmitter comprises:
processing module;
memory operably coupled to the processing module, wherein the memory includes operational instructions that cause the processing module to:
   determine an output power level of an outbound radio frequency (RF) signal; and
   enable at least one of a first enable signal and a second enable signal based on the determined output power level;
up-conversion module operably coupled to produce an RF signal from an I component of a low intermediate frequency (IF) outbound signal, a Q component of the low IF outbound signal, an I component of a local oscillation, and a Q component of the local oscillation;
highly linear power amplifier operably coupled to produce an amplified RF signal by amplifying the RF signal based on at least one of: a first enable signal and a second enable signal, wherein the highly linear power amplifier includes:
   component;
   first transistor pair coupled in series with the component, wherein a first transistor of the first transistor pair is coupled to receive the RF signal and wherein a second transistor of the first transistor pair is coupled to receive the first enable signal and is configured to enable the first transistor of the first transistor pair when the first enable signal is enabled and to disable the first transistor of the first transistor pair when the first enable signal is not enabled; and
   second transistor pair coupled in series with the component, wherein a first transistor of the second transistor pair is coupled to receive the RF signal, wherein a second transistor of the second transistor pair is coupled to receive the second enable signal, wherein when the first enable signal is enabled the highly linear power amplifier has a first gain with a first linearity and when the second enable signal is enabled the highly linear power amplifier has a second gain with the first linearity; and
output power amplifier operably coupled to produce the outbound RF signal by further amplifying the amplified RF signal.

9. The linear transmitter of claim 8, wherein the output power amplifier includes:
second component;
third transistor pair coupled in series with the second component, wherein a first transistor of the third transistor pair is coupled to receive the amplified RF signal and wherein a second transistor of the third transistor pair is coupled to receive a third enable signal; and
fourth transistor pair coupled in series with the second component, wherein a first transistor of the fourth transistor pair is coupled to receive the amplified RF signal, wherein a second transistor of the fourth transistor pair is coupled to receive a fourth enable signal, wherein processing module generates at least one of the third enable signal and the fourth enable signal based, at least in part, on the desired output level.

10. The linear transmitter of claim 8, wherein the highly linear power amplifier further comprises:
at least one other transistor pair coupled in series with the component, wherein a first transistor of the at least one other transistor pair is coupled to receive the RF signal, wherein a second transistor of the at least one other transistor pair is coupled to receive at least one other enable signal, and wherein when the at least one other enable signal is enabled the highly linear power amplifier has at least one other gain with the first linearity.

11. The linear transmitter of claim 8, wherein the highly linear power amplifier further comprises:
second component;
first complimentary transistor pair coupled in series with the second component, wherein a first transistor of the first complimentary transistor pair is coupled to receive a complimentary RF signal and wherein a second transistor of the first complimentary transistor pair is coupled to receive the first enable signal; and
second complimentary transistor pair coupled in series with the second component, wherein a first transistor of the second complimentary transistor pair is coupled to receive the complimentary signal, wherein a second transistor of the second complimentary transistor pair is coupled to receive the second enable signal.

12. A radio comprising:
receiver operably coupled to convert an inbound RF signal into an I component of an inbound low intermediate frequency (IF) signal and a Q component of the low IF signal based on an I component of a receiver local oscillation and a Q component of the receiver local oscillation; and
transmitter that includes:
   processing module;
   memory operably coupled to the processing module, wherein the memory includes operational instructions that cause the processing module to:
      determine an output power level of an outbound radio frequency (RE) signal; and
      enable at least one of a first enable signal and a second enable signal based on the determined output power level;
   up-conversion module operably coupled to produce an RE signal from an I component of a low intermediate frequency (IF) outbound signal, a Q component of the low IF outbound signal, an I component of a local oscillation, and a Q component of the local oscillation;
   highly linear power amplifier operably coupled to produce an amplified RE signal by amplifying the RE signal based on at least one of: a first enable signal and a second enable signal, wherein the highly linear power amplifier includes:
      component;
      first transistor pair coupled in series with the component, wherein a first transistor of the first transistor pair is coupled to receive the RF signal and wherein a second transistor of the first transistor pair is coupled to receive the first enable signal and is configured to enable the first transistor of the first transistor pair when the first enable signal is enabled and to disable the first transistor of the first transistor pair when the first enable signal is not enabled; and
      second transistor pair coupled in series with the component, wherein a first transistor of the second transistor pair is coupled to receive the RF signal, wherein a second transistor of the second transistor pair is coupled to receive the second enable signal, wherein when the first enable signal is enabled the highly linear power amplifier has a first gain with a first linearity and when the second enable signal is enabled the highly linear power amplifier has a second gain with the first linearity; and output power amplifier operably coupled to produce the outbound RF signal by further amplifying the amplified RF signal.

13. The radio of claim 12, wherein the output power amplifier includes:
   second component;
   third transistor pair coupled in series with the second component, wherein a first transistor of the third transistor pair is coupled to receive the amplified RF signal and wherein a second transistor of the third transistor pair is coupled to receive a third enable signal; and
   fourth transistor pair coupled in series with the second component, wherein a first transistor of the fourth transistor pair is coupled to receive the amplified RF signal, wherein a second transistor of the fourth transistor pair is coupled to receive a fourth enable signal, wherein processing module generates at least one of the third enable signal and the fourth enable signal based, at least in part, on the desired output level.

14. The radio of claim 12, wherein the highly linear power amplifier further comprises:
   at least one other transistor pair coupled in series with the component, wherein a first transistor of the at least one other transistor pair is coupled to receive the RF signal, wherein a second transistor of the at least one other transistor pair is coupled to receive at least one other enable signal, and wherein when the at least one other enable signal is enabled the highly linear power amplifier has at least one other gain with the first linearity.

15. The radio of claim 12, wherein the highly linear power amplifier further comprises:
   second component;
   first complimentary transistor pair coupled in series with the second component, wherein a first transistor of the first complimentary transistor pair is coupled to receive a complimentary RF signal and wherein a second transistor of the first complimentary transistor pair is coupled to receive the first enable signal; and
   second complimentary transistor pair coupled in series with the second component, wherein a first transistor of the second complimentary transistor pair is coupled to receive the complimentary signal, wherein a second transistor of the second complimentary transistor pair is coupled to receive the second enable signal.

16. A differential highly linear power amplifier comprises:
   first component;
   second component;
   first differential enable transistor pair operably coupled to the first and second components, wherein the first differential enable transistor pair is operably coupled to receive a first enable signal;
   first differential input transistor pair operably coupled to the first differential enable transistor pair, wherein the first differential input transistor pair is, when enabled by the first differential enable transistor pair, operably coupled to amplify a differential input signal at a first gain;
   second differential enable transistor pair operably coupled to the first and second components, wherein the second differential enable transistor pair is operably coupled to receive a second enable signal; and
   second differential input transistor pair operably coupled to the second differential enable transistor pair, wherein the second differential input transistor pair is, when enabled by the second differential enable transistor pair, operably coupled to amplify the differential input signal at a second gain.

17. The differential highly linear power amplifier of claim 16, wherein the first differential enable transistor pair, the first differential input transistor pair, the second differential enable transistor pair, and the second differential input transistor pair comprise at least one of:
   P-channel transistors; and
   N-channel transistors.

18. The differential highly linear power amplifier of claim 16 further comprises:
   third differential enable transistor pair operably coupled to the first and second components, wherein the third differential enable transistor pair is operably coupled to receive a third enable signal; and
   third differential input transistor pair operably coupled to the third differential enable transistor pair, wherein the third differential input transistor pair is operably coupled to receive the differential input signal.

* * * * *

UNITED STATES PATENT AND TRADEMARK OFFICE
CERTIFICATE OF CORRECTION

PATENT NO. : 7,088,969 B2 Page 1 of 1
APPLICATION NO. : 10/074537
DATED : August 8, 2006
INVENTOR(S) : Shahla Khorram It is certified that error appears in the above-identified patent and that said Letters Patent is hereby corrected as shown below:

Column 14, line 31, in Claim 12: replace "(RE)" with --(RF)--

Column 14, line 36, in Claim 12: replace "RE" with --RF--

Column 14, line 42, in Claim 12: replace "an amplified RE signal by amplifying the RE" with --an amplified RF signal by amplifying the RF--

Signed and Sealed this

Seventeenth Day of March, 2009

JOHN DOLL
*Acting Director of the United States Patent and Trademark Office*